(12) United States Patent
Jiang et al.

(10) Patent No.: US 11,085,575 B2
(45) Date of Patent: Aug. 10, 2021

(54) BRACKET ASSEMBLY AND DISPLAY DEVICE COMPRISING THE SAME

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Linfeng Jiang, Beijing (CN); Zhonghua Liu, Beijing (CN)

(73) Assignees: K-TRONICS (SUZHOU) TECHNOLOGY CO., LTD., Suzhou (CN); BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/425,092

(22) Filed: May 29, 2019

(65) Prior Publication Data
US 2020/0124226 A1    Apr. 23, 2020

(30) Foreign Application Priority Data
Oct. 18, 2018 (CN) .......................... 201821695777.4

(51) Int. Cl.
*F16M 11/10*      (2006.01)
*G06F 1/16*      (2006.01)
(Continued)

(52) U.S. Cl.
CPC ........... *F16M 11/10* (2013.01); *F16M 11/041* (2013.01); *G06F 1/1601* (2013.01);
(Continued)

(58) Field of Classification Search
CPC .... G06F 1/1601; G06F 1/1607; G06F 1/1633; G06F 1/166; G06F 2200/1613; F16M 11/10; F16M 2200/02; F16M 11/041; F16M 2200/08; F16M 11/22; F16M 13/02; F16M 11/16; F16M 13/00; E05C 17/30; E05C 1/002; E05C 1/02; E05C 1/04; E05C 1/08; E05C 1/10; F16B 7/10; F16B 7/042; Y10S 292/37; Y10S 248/917; Y10S 248/919; Y10T 292/0911; Y10T 292/0926;
(Continued)

(56) References Cited

U.S. PATENT DOCUMENTS 6,400,560 B1 * 6/2002 Chian ................. B60R 11/0235
                                                    248/917
7,099,148 B2 * 8/2006 Lee ...................... F16M 11/041
                                                  361/679.21
(Continued)

*Primary Examiner* — Ingrid M Weinhold

(57) ABSTRACT

A bracket assembly and a display device including the same are disclosed. The bracket assembly includes: a body; a head, pivotally connected with the body; and a button, mounted on the head and configured to move together with the head. The button includes: a button portion configured to move between a first position and a second position, and a clamping portion. The clamping portion is configured to be in a locking state in condition that the button portion is in the first position and to be in an unlocking state in condition that the button portion is in the second position. The bracket assembly further includes a reset element disposed between the button and the head and configured to keep the button portion in the first position and keep the clamping portion in the locking state.

13 Claims, 2 Drawing Sheets

(51) Int. Cl.
*F16M 11/04* (2006.01)
*H05K 5/02* (2006.01)

(52) U.S. Cl.
CPC ..... *F16M 2200/02* (2013.01); *F16M 2200/08* (2013.01); *H05K 5/0234* (2013.01)

(58) Field of Classification Search
CPC ......... Y10T 292/0934; Y10T 292/0951; Y10T 292/0952; Y10T 292/0953; Y10T 292/0956; Y10T 292/096; Y10T 292/0997; Y10T 292/1022; Y10T 292/1023; Y10T 292/1024; Y10T 292/1028; Y10T 292/432; Y10T 403/32475; Y10T 403/32483; Y10T 403/32524; Y10T 403/581; Y10T 403/60; Y10T 403/602; Y10T 403/604; A47B 91/00; A47B 13/021; F16L 37/098; H05K 5/0234; H05K 5/0201
USPC ............ 361/679.02, 679.21, 679.58, 679.01; 248/226.11, 188.8; 403/322.1
See application file for complete search history.

(56) References Cited

U.S. PATENT DOCUMENTS

| | | | | |
|---|---|---|---|---|
| 7,361,046 | B2* | 4/2008 | Drew | F16M 11/24 248/917 |
| 7,679,892 | B2* | 3/2010 | Jung | F16M 11/10 361/679.21 |
| 7,866,615 | B2* | 1/2011 | Hsuan | F16M 11/041 248/188.8 |
| 8,246,267 | B2* | 8/2012 | Svedberg | F16B 7/042 403/109.3 |
| 9,642,268 | B2* | 5/2017 | Huang | H05K 5/0234 |
| 10,317,936 | B2* | 6/2019 | Tseng | E05D 7/1061 |
| 10,620,662 | B2* | 4/2020 | Tseng | G06F 1/1601 |
| 2004/0165344 | A1* | 8/2004 | Lee | F16M 11/10 361/679.21 |
| 2006/0208145 | A1* | 9/2006 | Chen | F16M 11/16 248/289.11 |
| 2007/0002529 | A1* | 1/2007 | Drew | G06F 1/1601 361/679.22 |
| 2008/0232051 | A1* | 9/2008 | Zhou | F16M 11/10 361/679.05 |
| 2009/0085022 | A1* | 4/2009 | Svedberg | E04G 5/14 256/65.14 |
| 2010/0208420 | A1* | 8/2010 | Yang | F16M 11/041 361/679.01 |
| 2013/0094127 | A1* | 4/2013 | Lu | F16M 11/06 361/679.01 |
| 2016/0007489 | A1* | 1/2016 | Huang | F16M 11/10 361/679.01 |
| 2016/0239045 | A1* | 8/2016 | Tseng | G06F 1/1601 |
| 2019/0196534 | A1* | 6/2019 | Tseng | G06F 1/1637 |

* cited by examiner

BRACKET ASSEMBLY AND DISPLAY DEVICE COMPRISING THE SAME

CROSS REFERENCE TO RELATED APPLICATION

The application claims priority to the Chinese patent application No. 201821695777.4, filed Oct. 18, 2018, titled "Bracket Assembly for Display Device and Display Device Comprising the Same", the disclosure of which is incorporated herein by reference as part of the application.

TECHNICAL FIELD

Embodiments of the disclosure relate to a bracket assembly and a display device comprising the same.

BACKGROUND

Display devices such as computers and televisions typically include a display component such as a display and a bracket assembly for supporting the display component.

SUMMARY

Embodiments of the disclosure provide a bracket assembly and a display device comprising the bracket assembly.

The first aspect of the disclosure provides a bracket assembly, which comprises:
 a body;
 a head, pivotally connected with the body;
 a button, mounted on the head and configured to move together with the head, the button comprising:
   a button portion, configured to move between a first position and a second position; and
   a clamping portion, configured to be in a locking state in condition that the button portion is in the first position and further configured to be in an unlocking state in condition that the button portion is in the second position; and
 a reset element, disposed between the button and the head, the reset element being configured to keep the button portion in the first position and keep the clamping portion in the locking state.

The second aspect of the disclosure provides a bracket assembly for a display device. The display device comprises a rear casing assembly. The rear casing assembly is provided with a first through hole and a first clamping portion. The bracket assembly comprises:
 a body;
 a head, pivotally connected with the body and configured to be extended into the rear casing assembly through the first through hole;
 a button, mounted on the head and configured to be extended into the rear casing assembly together with the head through the first through hole, the button comprising:
   a button portion, configured to move between a first position and a second position; and
   a second clamping portion, configured to be in engagement with the first clamping portion in the rear casing assembly in condition that the button portion is in the first position, and further configured to be being out of engagement with the first clamping portion in the rear casing assembly in condition that the button portion is in the second position;
 a reset element, disposed between the button and the head, the reset element being configured to keep the button portion in the first position and keep the second clamping portion in the second position.

The third aspect of the disclosure provides a display device, which comprises the above bracket assembly for the display device.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
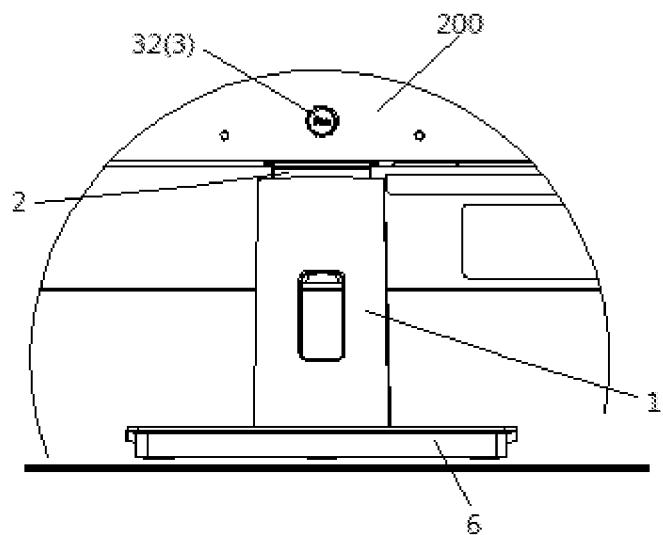
FIG. 1 is a partial rear view of a display device provided by an embodiment of the disclosure.

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

In general, the bracket assembly is mounted on a rear casing of a display component by means of threaded locking, which may cause problems: 1) labor and material costs are required in the process of locking; 2) in order to avoid hidden danger of insecure locking due to the user's own locking, the bracket assembly is often first locked on the display component when the display device leaves factory, and then the two are packaged and transported together, so that higher packaging cost is required; and 3) when the user needs to hang the display component on the wall, a connector for locking needs to be unwrapped to remove the bracket assembly from the display component, and then the wall hanging of the display component is implemented, which is cumbersome and inconvenient to operate.

Embodiments of the disclosure provide a bracket assembly, a bracket assembly for a display device, and a display device employing the bracket assembly.

An embodiment of the disclosure provides a bracket assembly, which comprises: a body; a head, pivotally connected with the body; and a button, mounted on the head and configured to move together with the head. The button comprises: a button portion, configured to move between a first position and a second position; and a clamping portion, configured to be in a locking state in condition that the button portion is in the first position and further configured to be in an unlocking state in condition that the button portion is in the second position. The bracket assembly further comprises a reset portion disposed between the button and the head, and the reset element is configured to keep the button portion in the first position and keep the clamping portion in the locking state.

The bracket assembly provided by the above embodiment does not include a threaded connector. Thus, the quick disassembly and assembly of the bracket assembly can be realized; the disassembly and assembly efficiency is high; and the disassembly and assembly cost is low. It should be understood that the above bracket assembly is applicable for various display devices such as computers, televisions, mobile phones and tablet PCs.

In at least some embodiments, the head comprises a housing, the housing is configured to define a mounting cavity and has a through hole formed thereon, wherein the button further comprises a base portion, the base portion is configured to be in the mounting cavity, and both the button portion and the clamping portion are disposed on the base portion and extended out of the mounting cavity through the through hole.

In at least some embodiments, the housing comprises a first housing and a second housing, the first housing and the second housing being detachably connected with each other, the mounting cavity is between the first housing and the second housing, and the through hole is formed in one of the first housing and the second housing.

In at least some embodiments, the through hole is formed in the first housing, the reset element is in the mounting cavity and is a cylindrical spring, and two axial ends of the cylindrical spring lean against the base portion and the second housing respectively.

In at least some embodiments, the bracket assembly further comprises: a connector, the connector being pivotally connected with the head, the body is fixedly mounted on the connector.

In at least some embodiments, the body comprises: a first housing and a second housing, the connector is fixedly mounted between the first housing and the second housing.

In at least some embodiments, the first housing is in threaded connection with the connector, and the second housing is fastened with the first housing.

Another embodiment of the disclosure provides a bracket assembly for a display device, the display device comprising a rear casing assembly and the rear casing assembly being provided with a first through hole and a first clamping portion; the bracket assembly comprising: a body; a head, pivotally connected with the body and configured to be extended into the rear casing assembly through the first through hole; and a button, mounted on the head and configured to be extended into the rear casing assembly together with the head through the first through hole. The button comprises: a button portion, configured to move between a first position and a second position; and a second clamping portion, configured to be in engagement with the first clamping portion in the rear casing assembly in condition that the button portion is in the first position, and further configured to be out of engagement with the first clamping portion in the rear casing assembly in condition that the button portion is in the second position. The bracket assembly further comprises: a reset element, disposed between the button and the head, the reset element being configured to keep the button portion in the first position and keep the second clamping portion in the second position.

With reference to FIG. 1 to FIG. 4, detailed description will be given below to the bracket assembly provided by the embodiment of the disclosure and the display device 1000 comprising the same.

Figure 2:
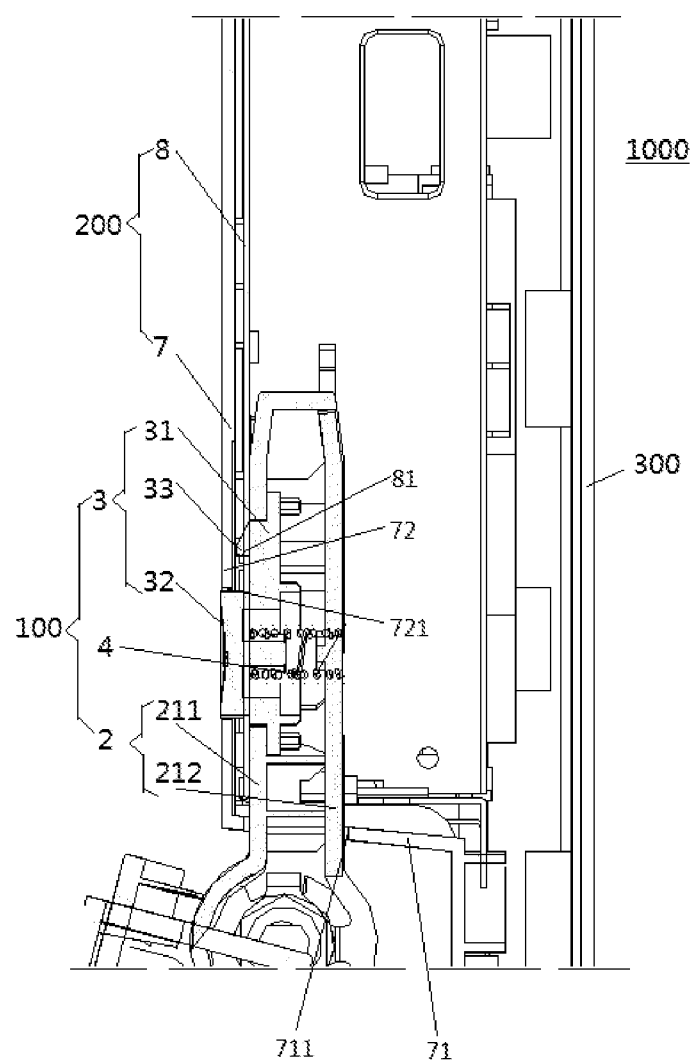
FIG. 2 is a partial sectional view of the display device of FIG. 1.

The display device 1000 provided by the embodiment of the disclosure is a device having at least display function, such as a computer display, or a television. As illustrated in FIG. 1 and FIG. 2, the display device 1000 provided by the embodiment of the disclosure not only comprises a display screen 300 but also comprises a bracket assembly 100 and a rear casing assembly 200. The display screen 300 is mounted on the front side of the rear casing assembly 200. The bracket assembly 100 supports the display screen 300 by supporting the rear casing assembly 200.

Figure 3:
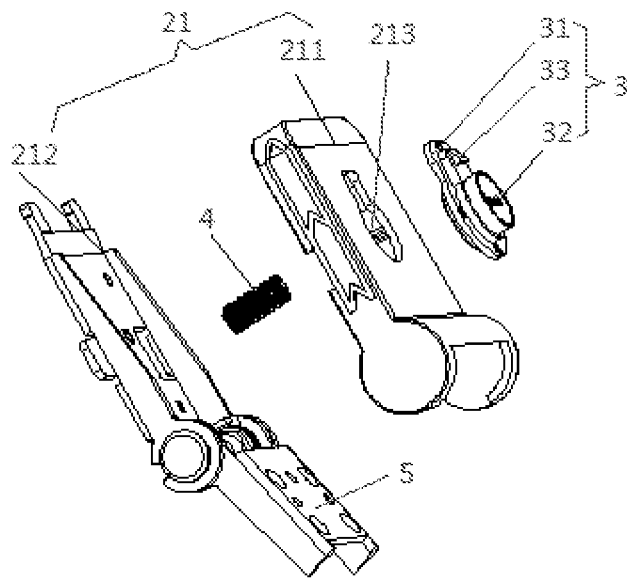
FIG. 3 is an exploded view of a head, a button, and a reset element in an embodiment of the disclosure.
Figure 4:
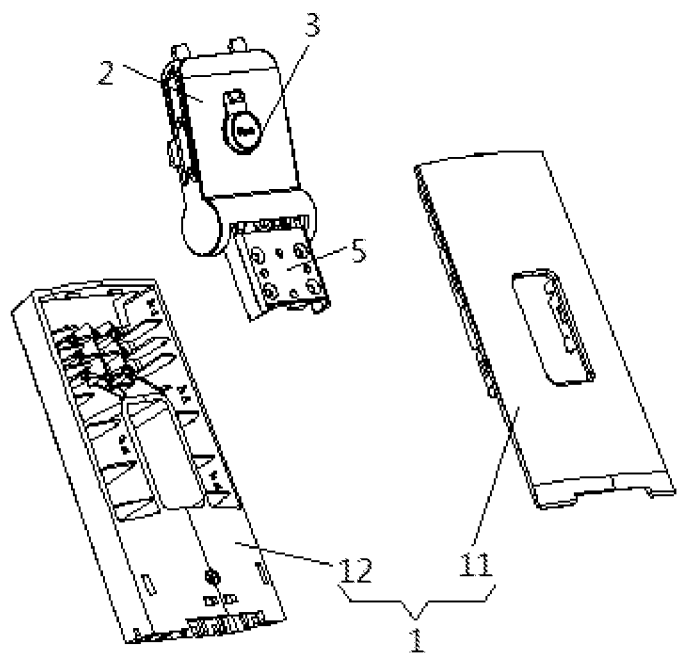
FIG. 4 is an exploded view of a bracket assembly provided by an embodiment of the disclosure.

As illustrated in FIG. 3 and FIG. 4, the bracket assembly 100 includes a body 1 and a head 2. The body 1 may include a pedestal 6, and may also not include the pedestal 6. In the case that the body does not include the pedestal 6, the body 1 is mounted on an independent pedestal 6. The head 2 is pivotally connected with the body 1 on one hand, and is fixedly connected with the rear casing assembly 200 on the other hand. Thus, the rear casing assembly 200 provided with the display screen 300 may be indirectly mounted on the body 1 through the head 2, and the rear casing assembly 200 adjusts angle relative to the body 1.

For instance, as illustrated in FIG. 1 and FIG. 2, a first through hole 711 is provided on the rear casing assembly 200, and the head 2 is adapted to be extended into the rear casing assembly 200 through the first through hole 711 (for example, at least a part of the head 2 is extended into the inside of the rear casing assembly 200 through the first through hole 711). In embodiments of the disclosure, "the inside of the rear casing assembly 200" refers to one side of the rear casing assembly 200 close to the display screen 300, namely the front side of the rear casing assembly 200; and its opposite side, one side of the rear casing assembly 200 away from the display screen 300, namely the rear side of the rear casing assembly 200, is defined as "the outside of the rear casing assembly 200".

For instance, as illustrated in FIG. 3 and FIG. 4, the rear casing assembly 200 is further provided with a second through hole 721 and a first clamping portion 81, and the bracket assembly 100 further comprises a button 3 and a reset element 4. For example, the button 3 is mounted on the head 2, and the button 3 is extended into the rear casing assembly 200 along with the head 2 through the first through hole 711, while the head 2 is extended into the rear casing assembly 200 through the first through hole 711.

For instance, as illustrated in FIG. 3 and FIG. 4, the button 3 includes a base portion 31, a button portion 32 and a second clamping portion 33. The button portion 32 and a second clamping portion 33 are formed on the button portion 32. While the second clamping portion 33 is pressed along a direction, the base portion 31 and the second clamping portion 33 are moved along the same direction, thus, the button portion 32 is moved together with the second clamping portion 33. The button portion 32 may be moved between a first position and a second position. For example, while the button portion 32 is extended to the outside of the rear casing assembly 200 (i.e., extended out of the rear casing assembly 200) through the second through hole 721 to arrive at a pop-up position (i.e., the first position), the second clamping portion 33 is synchronously in a locking state in which the second clamping portion is engaged with the first clamping portion 81 inside of the rear casing assembly 200. For example, while the button portion 32 is pressed and retracted to the inside of the rear casing assembly 200 through the second through hole 721, the button portion 32 arrives at a pressing position (i.e., the second position), the second clamping portion 33 is synchronously in an unlocking state in which the second clamping portion is disengaged from the first clamping portion 81 on the inside of the rear casing assembly 200. For example, the reset element 4 is disposed between the button 3 and the head 2 and configured to keep the button portion 32 in the pop-up position and keep the second clamping portion 33 in the locking state. In other embodiments of the disclosure, the bottom portion 32 may adopt other movement ways to arrive at the first or second position, such as rotating, etc.

When the rear casing assembly 200 is being assembled with the bracket assembly 100, the head 2 is extended into the first through hole 711, and the button portion 32 is extended out of the second through hole 721 so as to arrive at the pop-up position, at the same time, the second clamping portion 33 is in the locking state in which the second clamping portion is engaged with the first clamping portion 81, thereby realizing the locking connection between the bracket assembly 100 and the rear casing assembly 200 and finishing assembly. When the bracket assembly 100 is disassembled from the rear casing assembly 200, the button portion 32 is pressed and retracted into the pressing position through the second through hole 721, at the same time, the second clamping portion 33 is in the unlocking state in which the second clamping portion is disengaged from the first clamping portion 81 so as to realize the unlocking of the bracket assembly 100 and the rear casing assembly 200, and then the head 2 can be pulled out of the first through hole 711, thereby finishing disassembly.

As can be seen, according to the display device 1000 provided by the embodiment of the disclosure, the assembly and disassembly process of the bracket assembly 100 and the rear casing assembly 200 does not include any threaded connector. Thus, the rapid assembly or disassembly of the bracket assembly 100 can be realized; the assembly and disassembly efficiency is high; and the assembly and disassembly cost is low. Moreover, because the second clamping portion 33 and the first clamping portion 81 are engaged with each other on the inside of the rear casing assembly 200, the second clamping portion 33 and the first clamping portion 81 can be shielded by the rear casing assembly 200 and will not be seen by the user, in this way, both the second clamping portion 33 and the first clamping portion 81 are difficult to be in contact with a foreign object, which can avoid damage, pollution or corrosion, and increase the fastening firmness and the service life of the first clamping portion 81 and the second clamping portion 33, and can further increase the aesthetic property of the display device 1000.

Furthermore, due to the convenient assembly or disassembly of the bracket assembly 100 and the rear casing assembly 200, when the display device 1000 leaves factory, the bracket assembly 100 and the rear casing assembly 200 can be respectively packaged, so as to save the package cost, reduce manpower and materials, and have low input cost. When the display device 1000 arrives at the user's house, the user can simply and quickly finish the assembly of the bracket assembly 100 and the rear casing assembly 200 and can ensure the firm connection between the bracket assembly 100 and the rear casing assembly 200. In addition, if the display device 1000 needs to hang on the wall, it is also simple and rapid to disassemble the bracket assembly 100 from the display device, so the cost can be reduced and the efficiency can be increased.

It should be understood that there are multiple optional structures of the first clamping portion 81 and the second clamping portion 33 capable of realizing engagement. For instance, both the first clamping portion 81 and the second clamping portion 33 are in the shape of a grab. Moreover, for instance, one of the first clamping portion 81 and the second clamping portion 33 is in the shape of a grab, and the other one is in the shape of a groove or a snap ring. No more examples will be given here.

In some embodiments, as illustrated in FIG. 3 and FIG. 4, the head 2 may include a housing 21; a mounting cavity is defined in the housing 21; and a third through hole 213 is formed in the housing 21. The button 3 includes a base portion 31 which is disposed in the mounting cavity and cannot be extended out of the mounting cavity from the third through hole 213. Both the button portion 32 and the second clamping portion 33 are disposed on the base portion 31 and they are extended out of the mounting cavity from the third through hole 213. Thus, the mounting reliability of the button 3 and the head 2 can be good, and it can be simply and effectively ensured that the button 3 is capable of flexibly moving between the pop-up position and the pressing position relative to the head 2.

For instance, in the specific example as illustrated in FIG. 3 and FIG. 4, the housing 21 may include a first housing 211 and a second housing 212; the first housing 211 and the second housing 212 are detachably connected with each other (for instance, detachably connected with each other through a threaded connector or a clamping connector); the mounting cavity is defined between the first housing 211 and the second housing 212; and the third through hole 213 is formed in one of the first housing 211 and the second housing 212. Thus, the assembly of the button 3 and the head 2 can be convenient. Moreover, because the third through hole 213 is formed in the first housing 211 or the second housing 212, the processing difficulty and the assembly precision can be reduced, and then the production cost can be reduced.

Moreover, as illustrated in FIG. 3 and FIG. 4, the third through hole 213 may be formed in the first housing 211; the reset element 4 may be disposed in the mounting cavity and is a cylindrical spring; and two axial ends of the cylindrical spring lean against the base portion 31 and the second housing 212, respectively. Thus, the assembly of the reset element 4 can be convenient, and the reset element 4 can simply, effectively and reliably provide restoring force for the button 3.

Of course, the disclosure is not limited thereto. For instance, in other embodiments, half of the third through hole 213 may also be formed in the first housing 211, and the other half of the third through hole 213 is formed in the second housing 212. After the first housing 211 and the second housing 212 are fastened in position, they can be combined to obtain a complete third through hole 213 (the example is not illustrated in the figure). In addition, the reset element 4 is not limited to the cylindrical spring, for instance, it may also be a Belleville disc spring, a rubber pad (the example is not illustrated in the figure), etc. Moreover, in other embodiments of the disclosure, the reset element 4 may also be disposed on the outside of the mounting cavity (the example is not illustrated in the figure), so no further description will be given here. In addition, the head 2 may also be constructed in other forms and engaged with the button 3 by other means, and no further description will be given here.

In some embodiments of the disclosure, the bracket assembly 100 may further include: a connector 5 which is pivotally connected with the head 2, in which the body 1 is fixedly mounted to the connector 5. Thus, the rotatable connection between the body 1 and the head 2 can be simply and effectively guaranteed. It should be understood here that there are multiple specific ways for "the pivotal connection between the connector 5 and the head 2". For instance, the head 2 further includes a first pivotal portion; the connector 5 further includes a second pivotal portion; and the first pivotal portion and the second pivotal portion are pivotally connected to each other, in which one of the first pivotal portion and the second pivotal portion may be a rotary shaft, and the other may be a shaft hole Optionally, as illustrated in FIG. 3 and FIG. 4, the body 1 may include a first housing 11 and a second housing 12, and the connector 5 is fixed between the first housing 11 and the second housing. Thus, the connection between the body 1 and the connector 5 can be simply and effectively guaranteed. Moreover, the connector 5 can be clamped between the first housing 11 and the second housing 12, so as to ensure the beautiful appearance of the body 1. For instance, in one specific example, the first housing 11 is in threaded connection with the connector 5 (namely connected through a threaded connector such as a screw), and the second housing 12 is fastened with the first housing 11 (namely connected through a fastener). Thus, on one hand, the mounting reliability between the connector 5 and the body 1 can be guaranteed, and on the other hand, the threaded connector cannot be seen from the appearance of the body 1, so the beautiful appearance of the body 1 can be guaranteed.

In some embodiments of the disclosure, as illustrated in FIG. 2, the rear casing assembly 200 may include: an outer shell and an inner cover 8; the inner cover 8 is disposed inside the outer shell 7; both the first through hole 711 and the second through hole 721 are formed in the outer shell 7; and the first clamping portion 81 is disposed on the inner cover 8. Thus, suitable materials (e.g., plastic materials) can be selected to manufacture the outer shell 7 according to appearance and other needs, and suitable materials (e.g., metallic materials) can be selected to manufacture the inner cover 8 according to strength and other needs. As a result, firstly, the appearance of the rear casing assembly 200 of the display device 1000 can be guaranteed to satisfy the requirement; secondly, enough connection reliability between the rear casing assembly 200 and the bracket assembly 100 can be guaranteed; and thirdly, the arrangement of the inner cover 8 can also satisfy other own requirements of the display device 1000, for instance, relevant requirements such as shielding.

As illustrated in FIG. 2, the outer shell 7 may include a bottom shell portion 71 and a rear shell portion 72. For example, the bottom shell portion 71 is disposed at a lower end of the rear shell portion 72; in this case, the first through hole 711 is formed in the bottom shell portion 71, the second through hole 721 is formed in the rear shell portion 72, the first clamping portion 81 is disposed above the second through hole 721, and the second clamping portion 33 is disposed above the button portion 32. Thus, after the head 2 equipped with the button 3 is extended into the first through hole 711 from bottom to up, under the action of the reset element 4, the button portion 32 is extended out of the second through hole 721, and the second clamping portion 33 is fastened with the first clamping portion 81, so the assembly efficiency can be further increased. Similarly, in the case of disassembly, after the button portion 32 is pressed and retracted into the second through hole 721, the second clamping portion 33 and the first clamping portion 81 are automatically unlocked. In this case, when the body 1 is pulled down, the head 2 can be pulled out from the rear casing assembly 200 together with the button 3, so the disassembly efficiency can be improved.

Of course, the disclosure is not limited thereto. In addition to the realization of assembly by adoption of the lower insertion method as described above, in other embodiments of the disclosure, after the positions of the first through hole 711 and the second through hole 721 are adjusted, left insertion, right insertion, upper insertion and the like may also be adopted. No further description will be given here.

In the description of the disclosure, it should be understood that the orientation or positional relationship indicated by the term such as "above", "below", "front", "rear", "top", "bottom", "inside" or "outside" is based on the orientation or positional relationship as illustrated in the drawings, and is merely for the convenient description of the disclosure and the simplified description, and does not indicate or imply that the device or component has specific orientation and is constructed and operated in specific orientation, and thus should not to be construed as the limitation of the disclosure. Moreover, the terms "first", "second" and "third" are used for descriptive purposes only and are not to be construed as indicating or implying the relative importance or implicitly indicating the number of indicated technical characteristics. Thus, the characteristics with the definition "first", "second" and "third" may include one or more of the characteristics, either explicitly or implicitly. In the description of the disclosure, the meaning of "a plurality" is two or more than two, unless otherwise specifically stated.

In the disclosure, unless otherwise specifically stated, the terms "mounted", "connected", "connection", "fixed" and the like should be understood broadly and, for instance, may be direct connection or indirect connection through an intermedium, and can be the internal communication of two components or the interaction of two components. The specific meanings of the above terms in the disclosure can be understood by those skilled in the art on a case-by-case basis. In the disclosure, unless otherwise specifically stated, the first feature "above" or "below" the second feature may be that: the first and second features are in direct contact with each other, or the first and second features are in indirect contact through an intermedium. Moreover, the first feature "on", "over" or "above" the second feature may be that the first feature is over or above the second feature, or merely that the height of the first feature is higher than that of the second feature. The first feature "beneath", "under" or "below" the second feature may be that the first feature is under or below the second feature, or merely that the height of the first feature is less than that of the second feature.

In the description of the present disclosure, the description with reference to the term "one embodiment", "some embodiments", "an example", "a specific example", "some examples" or the like means specific characteristics, structures, materials or features described in connection with the embodiment or examples are included in at least one embodiment or example of the disclosure. In the present description, the schematic representation of the above terms is not necessarily directed to the same embodiment or example. Moreover, the described particular characteristics, structures, materials or features may be combined in a suitable manner in any one or more embodiments or examples. In addition, different embodiments or examples described in the description and the characteristics of different embodiments or examples can be combined by those skilled in the art without contradicting each other.

While the embodiments of the disclosure have been illustrated and described, it should be understood by those skilled in the art that various changes, modifications, substitutions and variations can be made to these embodiments without departing from the spirit and scope of the disclosure, and the scope of the disclosure is defined by the claims and their equivalents.

The invention claimed is:

1. A bracket assembly, comprising:
a body;
a head, pivotally connected with the body;
a button, mounted on the head and configured to move together with the head, the button comprising:
  a button portion, configured to move between a first position and a second position; and
  a clamping portion, configured to be in a locking state in condition that the button portion is in the first position and further configured to be in an unlocking state in condition that the button portion is in the second position;
a reset portion, disposed between the button and the head, the reset portion being configured to keep the button portion in the first position and keep the clamping portion in the locking state;
wherein the head comprises a housing, the housing is configured to define a mounting cavity and has a through hole formed thereon;
wherein the button further comprises a base portion, the base portion is configured to be in the mounting cavity, and both the button portion and the clamping portion are disposed on the base portion and extended out of the mounting cavity through the through hole; and
wherein the housing of the head comprises a first housing and a second housing, the first housing and the second housing being detachably connected with each other, the mounting cavity is between the first housing and the second housing, and the through hole is formed in one of the first housing and the second housing.

2. The bracket assembly according to claim 1, wherein the through hole is formed in the first housing, the reset portion is in the mounting cavity and is a cylindrical spring, and two axial ends of the cylindrical spring lean against the base portion and the second housing respectively.

3. The bracket assembly according to claim 1, further comprising:
a connector, the connector being pivotally connected with the head, the body is fixedly mounted on the connector.

4. The bracket assembly according to claim 3, wherein the body comprises: a first housing and a second housing, the connector is fixedly mounted between the first housing and the second housing of the body.

5. A bracket assembly for a display device, the display device comprising a rear casing assembly and the rear casing assembly being provided with a first through hole; the bracket assembly comprising:
a body;
a head, pivotally connected with the body and configured to be extended into the rear casing assembly through the first through hole;
a button, mounted on the head and configured to be extended into the rear casing assembly together with the head through the first through hole, the button comprising:
  a button portion, configured to move between a first position and a second position; and
  a second clamping portion, configured to be in engagement with a first clamping portion in the rear casing assembly in condition that the button portion is in the first position, and further configured to be out of engagement with the first clamping portion in the rear casing assembly in condition that the button portion is in the second position; and
a reset element, disposed between the button and the head, the reset element being configured to keep the button portion in the first position and keep the second clamping portion in the second position;
wherein the head comprises a housing, the housing is configured to define a mounting cavity and has a third through hole formed thereon;
wherein the button further comprises a base portion, the base portion is configured to be in the mounting cavity, and both the button portion and the second clamping portion are disposed on the base portion and extended out of the mounting cavity through the third through hole; and
wherein the housing of the head comprises a first housing and a second housing, the first housing and the second housing of the head being detachably connected with each other, the mounting cavity is between the first housing and the second housing, and the third through hole is formed in one of the first housing and the second housing.

6. The bracket assembly for the display device according to claim 5, wherein the rear casing assembly further comprises: a second through hole, wherein the button portion is further configured to be extended out of the rear casing assembly through the second through hole to arrive at the first position and be retracted into the rear casing assembly through the second through hole to arrive at the second position.

7. The bracket assembly for the display device according to claim 5, wherein the third through hole is formed in the first housing, the reset element is in the mounting cavity and is a cylindrical spring, and two axial ends of the cylindrical spring lean against the base portion and the second housing respectively.

8. The bracket assembly for the display device according to claim 5, wherein the bracket assembly further comprises: a connector, the connector being pivotally connected with the head, the body is fixedly mounted on the connector.

9. The bracket assembly for the display device according to claim 8, wherein the body comprises a first housing and a second housing, and the connector is fixedly mounted between the first housing of the body and the second housing of the body.

10. The bracket assembly for the display device according to claim 9, wherein the first housing is in threaded connection with the connector, and the second housing is fastened with the first housing.

11. A display device, comprising a bracket assembly for the display device, and a rear casing assembly, the rear casing assembly being provided with a first through hole; wherein the bracket assembly comprises:
a body;
a head, pivotally connected with the body and configured to be extended into the rear casing assembly through the first through hole;
a button, mounted on the head and configured to be extended into the rear casing assembly together with the head through the first through hole, the button comprising:
  a button portion, configured to move between a first position and a second position; and
  a second clamping portion, configured to be in engagement with a first clamping portion in the rear casing assembly in condition that the button portion is in the first position, and further configured to be out of engagement with the first clamping portion in the rear casing assembly in condition that the button portion is in the second position; and a reset element, disposed between the button and the head, the reset element being configured to keep the button portion in the first position and keep the second clamping portion in the second position;

wherein the head comprises a housing, the housing is configured to define a mounting cavity and has a third through hole formed thereon;

wherein the button further comprises a base portion, the base portion is configured to be in the mounting cavity, and both the button portion and the second clamping portion are disposed on the base portion and extended out of the mounting cavity through the third through hole;

wherein the housing comprises a first housing and a second housing, the first housing and the second housing being detachably connected with each other, the mounting cavity is between the first housing of the head and the second housing of the head, and the third through hole is formed in one of the first housing of the head and the second housing of the head; and wherein the rear casing assembly further comprises: a second through hole, the button portion is further configured to be extended out of the rear casing assembly through the second through hole to arrive at the first position and be retracted into the rear casing assembly through the second through hole to arrive at the second position.

12. The display device according to claim 11, wherein the rear casing assembly comprises: an outer shell and an inner cover, the inner cover being disposed in the outer shell; both the first through hole and the second through hole are formed in the outer shell.

13. The display device according to claim 12, wherein the outer shell comprises a bottom shell portion and a rear shell portion, the bottom shell portion is disposed at a lower end of the rear shell portion; the first through hole is formed in the bottom shell portion; the second through hole is formed in the rear shell portion; and the second clamping portion is disposed above the button portion.

* * * * *